(12) United States Patent
Stautner

(10) Patent No.: US 8,922,308 B2
(45) Date of Patent: Dec. 30, 2014

(54) SYSTEMS AND METHODS FOR ALTERNATINGLY SWITCHING A PERSISTENT CURRENT SWITCH BETWEEN A FIRST MODE AND A SECOND MODE

(75) Inventor: Ernst Wolfgang Stautner, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 317 days.

(21) Appl. No.: 13/285,038

(22) Filed: Oct. 31, 2011

(65) Prior Publication Data

US 2013/0109574 A1    May 2, 2013

(51) Int. Cl.
*H01F 1/00* (2006.01)
*H01F 6/00* (2006.01)
*G01R 33/3815* (2006.01)
*H01L 39/20* (2006.01)

(52) U.S. Cl.
CPC ............ *G01R 33/3815* (2013.01); *H01L 39/20* (2013.01)
USPC ........................................................ 335/216

(58) Field of Classification Search
CPC ............. H01F 6/04; H01F 6/003; H01F 6/06; H01L 39/20; G01R 33/3815
USPC .................... 335/216, 296–299, 219; 505/163
See application file for complete search history.

(56) References Cited

U.S. PATENT DOCUMENTS

| | | | | |
|---|---|---|---|---|
| 4,906,861 | A * | 3/1990 | Roy et al. ...................... | 307/138 |
| 6,107,905 | A * | 8/2000 | Itoh et al. ...................... | 335/216 |
| 7,509,815 | B2 * | 3/2009 | van Hasselt .................... | 62/51.1 |
| 8,384,504 | B2 * | 2/2013 | Diederichs et al. ........... | 335/216 |
| 2009/0267716 | A1 | 10/2009 | Tanaka et al. | |
| 2012/0094840 | A1 * | 4/2012 | Tanaka et al. ................. | 505/211 |

FOREIGN PATENT DOCUMENTS

| | | |
|---|---|---|
| EP | 0145941 A1 | 6/1985 |
| EP | 0470762 A1 | 2/1992 |
| EP | 0874376 A2 | 10/1998 |
| JP | 9298320 A | 11/1997 |
| WO | 2010073146 A2 | 7/2010 |

OTHER PUBLICATIONS

Search Report from corresponding GB Application No. GB1219193.8 dated Mar. 1, 2013.

* cited by examiner

*Primary Examiner* — Bernard Rojas
(74) *Attorney, Agent, or Firm* — Seema S. Katragadda

(57) ABSTRACT

A persistent current switch is presented. One embodiment of the persistent current switch includes a vacuum chamber. The persistent current switch also includes a cooling unit disposed within the vacuum chamber and configured to circulate a coolant between a first layer and a second layer of the cooling unit. Further, the persistent current switch includes a winding unit disposed on at least one of the first layer and the second layer of the cooling unit and configured to switch the persistent current switch from the first mode to the second mode when a temperature associated with the winding unit is below a threshold temperature. In addition, the persistent current switch includes a heating unit thermally coupled to the winding unit and configured to enhance the temperature of the winding unit above the threshold temperature to transition the persistent current switch from the second mode to the first mode.

7 Claims, 6 Drawing Sheets

SYSTEMS AND METHODS FOR ALTERNATINGLY SWITCHING A PERSISTENT CURRENT SWITCH BETWEEN A FIRST MODE AND A SECOND MODE

BACKGROUND

The disclosure relates generally to superconducting systems and more specifically to systems and methods for alternatingly switching a persistent current switch between a resistive mode and a superconductive mode in magnetic resonance imaging (MRI) systems.

A superconducting magnet is used to produce a magnetic field in MRI systems. In some methods, an electric current from a power source is constantly applied to the superconducting magnet to produce the magnetic field. However, production of such a strong magnetic field entails a constant supply of the electric current in a range of hundreds of amperes. This constant supply of electric current to the superconducting magnet increases the running cost of the MRI system.

Furthermore, in certain other techniques, the superconducting magnet is excited to operate in a persistent current mode, where the electric current persistently flows in a superconducting loop without any current supply from the power source. Particularly, a persistent current switch is coupled in parallel to the superconducting magnet and the power source. Moreover, the persistent current switch is alternatingly switched from a normal state to a superconducting state to operate the superconducting magnet in the persistent current mode. These techniques are widely used in magnetic devices, such as MRI systems. However, while operating in the normal state, enormous amount of heat is produced by the persistent current switch. It is desirable to optimally dissipate this heat from the persistent current switch to transition the switch from the normal state to the superconducting state without high boil-off of cryogen in the MRI system.

In a conventional system, a superconducting magnet is housed in a helium vessel containing about 2000 liters of liquid helium (He). Further, the persistent current switch is fitted around the superconducting magnet with the persistent current switch immersed in this helium vessel. Since this arrangement employs a large vessel with thousands of liters of liquid He, the arrangement is not only expensive to manufacture, but also heavy to transport and install at a desired location, e.g., diagnostic centers. Additionally, the refill of thousands of liters of liquid He for delivery to remote locations after completing the ride through to the customer, may be inconvenient.

Moreover, the liquid He in these systems can sometimes boil-off during a quench event. The boiled-off helium escapes from the cryogen bath in which the magnetic coils are immersed. Thus, each quench event is followed by re-filling of the liquid He and re-ramping of the magnet, which is an expensive and time consuming event. Additionally, in conventional magnetic devices, a sophisticated exterior venting system is needed to vent the gas, such as boiled-off helium, through venting pipe stacks after the magnet and/or the switch quenches. However, the venting pipes are difficult to install. Also, in some situations, the venting of helium can have environmental or regulatory concerns. Thus, conventional MRI magnet designs and their cooling arrangements can entail special installation requirements, the inability to install these systems in certain regions, and a high maintenance cost.

BRIEF DESCRIPTION

Briefly in accordance with one aspect of the present technique, a persistent current switch for alternatingly switching between a first mode and a second mode is presented. The persistent current switch includes a vacuum chamber. The persistent current switch also includes a cooling unit disposed within the vacuum chamber and configured to circulate a coolant between a first layer and a second layer of the cooling unit. Further, the persistent current switch includes a winding unit disposed on at least one of the first layer and the second layer of the cooling unit and configured to switch the persistent current switch from the first mode to the second mode when a temperature associated with the winding unit is below a threshold temperature. In addition, the persistent current switch includes a heating unit thermally coupled to the winding unit and configured to enhance the temperature of the winding unit above the threshold temperature to transition the persistent current switch from the second mode to the first mode.

In accordance with further aspects of the present technique, a method for alternatingly switching a persistent current switch between a first mode and a second mode is presented. The method includes disposing at least a cooling unit and a winding unit within a vacuum chamber. The method further includes switching the persistent current switch from the first mode to the second mode by reducing a temperature of the winding unit below the threshold temperature, wherein the temperature is reduced below the threshold temperature by circulating a coolant between a first layer and a second layer of the cooling unit. The method also includes transitioning the persistent current switch from the second mode to the first mode by enhancing the temperature of the winding unit above the threshold temperature.

In accordance with another aspect of the present technique, a switching system is presented. The switching system includes a persistent current switch disposed in a low magnetic field region and configured to alternatingly switch between a first mode and a second mode. The persistent current switch includes a vacuum chamber and a cooling unit disposed within the vacuum chamber and configured to store a coolant at least between a first layer and a second layer of the cooling unit. The persistent current switch also includes a winding unit disposed on at least one of the first layer and the second layer of the cooling unit and configured to switch the persistent current switch from the first mode to the second mode when a temperature associated with the winding unit is below a threshold temperature. Additionally, the persistent current switch includes a heating unit thermally coupled to the winding unit and configured to enhance the temperature of the winding unit above the threshold temperature to transition the persistent current switch from the second mode to the first mode. Further, the switching system includes a superconducting magnet coupled to the persistent current switch, wherein the superconducting magnet is configured to generate a magnetic field based on the switching of the persistent current switch between the first mode and the second mode.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

As will be described in detail hereinafter, various embodiments of an exemplary persistent current switch and methods for alternatingly switching between a first mode and a second mode are presented. By employing the methods and the various embodiments of the persistent current switch described hereinafter, size of the magnetic devices, cost of manufacturing, cost of installing, and cost of running the magnetic devices, such as MRI systems may be substantially reduced.

Figure 1:
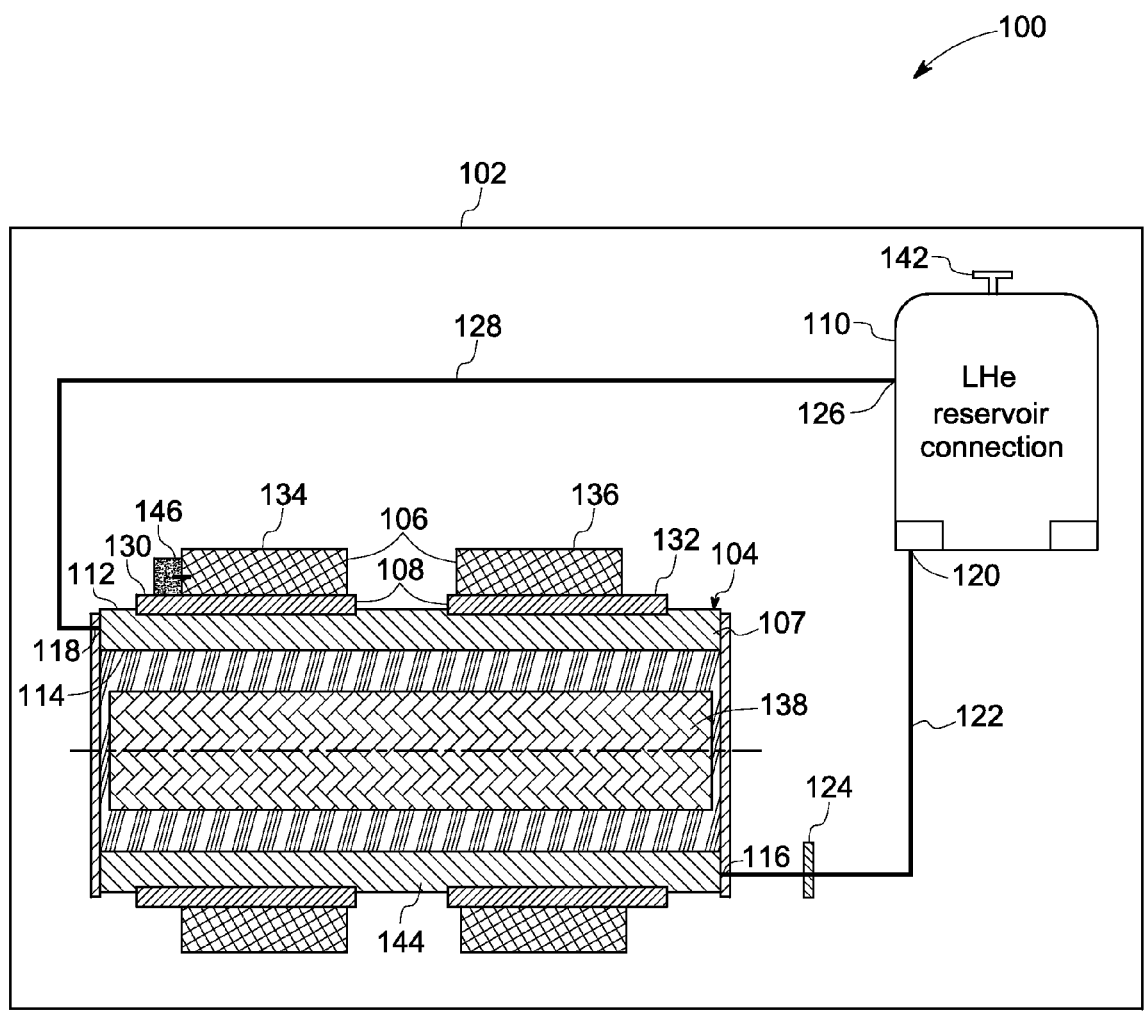
FIG. 1 is a cross-sectional side view of a persistent current switch, in accordance with aspects of the present technique.

Turning now to the drawings, and referring to FIG. 1, a cross-sectional side view of a persistent current switch 100, in accordance with aspects of the present technique, is depicted. The persistent current switch 100 may be configured to alternatingly switch between a first mode and a second mode. The first mode may be representative of a normal state where the persistent current switch 100 provides high electrical resistance. Similarly, the second mode may be representative of a superconducting state where the persistent current switch 100 provides zero electrical resistance. It may be noted that the terms "normal state" and "first mode" are used interchangeably and the terms "superconducting state" and "second mode" are used interchangeably. The persistent current switch 100 is typically employed to operate a superconducting magnet in a persistent current mode.

In a presently contemplated configuration, the persistent current switch 100 includes a vacuum chamber 102, a cooling unit 104, a winding unit 106, a heating unit 108, and a reservoir 110. The vacuum chamber 102 may be disposed as a unit in a magnetic device, such as a MRI system (shown in FIG. 6). It may be noted that the implementation of the persistent current switch 100 is not limited to MRI systems, and may be implemented in other devices, such as superconducting electrical machines, superconducting magnet energy storage and the like. In one embodiment the vacuum chamber/environment may already exist in the MRI system and the magnet and the persistent current switch may be implemented in the existing vacuum environment. For example, the persistent current switch may share the vacuum of the MRI system of FIG. 6.

Further, the cooling unit 104 is disposed within the vacuum chamber 102 and is configured to cool the persistent current switch 100. More specifically, the cooling unit 104 is configured to circulate a coolant 107 between a first layer 112 and a second layer 114 of the cooling unit 104. The coolant 107 may include liquid helium LHe, liquid hydrogen ($LH_2$), liquid neon (LNe), liquid nitrogen ($LN_2$) or combinations thereof. In one embodiment, the persistent current switch 100 may be a low temperature superconductor, a medium temperature superconductor, or a high temperature superconductor. Also, the coolant may be selected based on the type of superconductor used for the persistent current switch 100. For example, the persistent current switch having a low temperature superconductor may employ liquid helium (LHe) as the coolant. Similarly, for a medium temperature superconductor, LHe, liquid neon (LNe), or liquid hydrogen ($LH_2$) may be used as the coolant. Furthermore, for a high temperature superconductor, LNe or liquid nitrogen ($LN_2$) may be used as the coolant in the system.

Furthermore, in an exemplary embodiment, the cooling unit 104 is configured to reduce a temperature of the winding unit 106 below a threshold temperature. The cooling unit 104 may be formed by inserting one metal tube into another metal tube, as depicted in FIG. 1. For example, a first metal tube 112 may form the first layer 112 of the cooling unit 104, while a second metal may form the second layer 114 of the cooling unit 104. The second layer 114 may be a thick layer of brass, aluminum, and/or copper, for example. In one embodiment, the first metal tube 112 may be configured to surround/enclose the second metal tube 114 such that a hollow space 144 is formed between the first metal tube 112 and the second metal tube 114. This hollow space 144 is used for storing or circulating the coolant 107 in the cooling unit 104. It may be noted that the terms "outer layer" and "first layer" may be used interchangeably. Similarly, the terms "inner layer" and "second layer" may be used interchangeably in the below description. Further, the coolant 107 in the hollow space 144 between the first layer 112 and the second layer 114 of the cooling unit 104 is used for reducing the temperature of the winding unit 106.

In accordance with another embodiment, the cooling unit 104 may be a cylindrical metal rod. The cylindrical metal rod may be a brass, aluminum, and/or copper rod, for example. Furthermore, the cylindrical metal rod may include a first cavity surrounded by a metal portion, which is further surrounded by a second cavity. The first cavity is filled with filler materials to distribute the heat across the metal portion, and the second cavity is filled with the coolant to absorb the heat from the metal portion. Moreover, the cylindrical copper rod may include a fin like structure that enables enhanced heat exchange with the surrounding coolant.

In addition, an inlet 116 may be provided at one end of the cooling unit 104 and an outlet 118 may be provided at the other end of the cooling unit 104. However, in certain embodiments, the inlet 116 and the outlet 118 may be provided at the same end of the cooling unit 104. Further, the inlet 116 is operatively coupled to an outlet 120 of the reservoir 110. It may be noted that the terms "reservoir" and "coolant reservoir" may be used interchangeably. The inlet 116 is configured to receive the coolant from the reservoir 110. In one example, a first channel 122 that operatively couples the inlet 116 of the cooling unit 104 and the outlet 120 of the reservoir 110 may be employed to convey the coolant from the reservoir 110 to the cooling unit 104. In addition, an orifice or a valve 124 is disposed along the first channel 122 to regulate the flow of coolant from the reservoir 110 to the cooling unit 104. In one embodiment, the inlet 116 of the cooling unit 104 is configured to receive the coolant from the reservoir 110 when the heating unit 108 is de-energized or turned OFF and at least a portion of the coolant 107 in the cooling unit 104 is evaporated. The reservoir 110 may also be referred to as a storage unit for storing and/or condensing the coolant. In certain embodiments, the reservoir 110 may include a release valve 142. The release valve 142 may be configured to aid in controlling any pressure build-up within the reservoir 110. The release valve 142 may be configured to automatically and/or manually release any pressure build-up within the reservoir 110.

In a similar manner, the outlet 118 of the cooling unit 104 is operatively coupled to an inlet 126 of the reservoir 110 and is configured to convey evaporated coolant from the cooling unit 104 to the reservoir 110. Particularly, the outlet 118 of the cooling unit 104 is configured to convey the evaporated coolant from the cooling unit 104 to the reservoir 110 when the heating unit 108 is energized or turned ON. In the exemplary embodiment of FIG. 1, a second channel 128 that operatively couples the outlet 118 of the cooling unit 104 and the inlet 126 of the reservoir 110 may be configured to convey the evaporated coolant from the cooling unit 104 to the reservoir 110. In one embodiment, the evaporated coolant is re-condensed by the reservoir 110. Moreover, the re-condensed coolant may be re-circulated to the cooling unit 104. In certain other embodiments, the coupling of the second channel 128 to the reservoir 110 is optional and may not be used in the persistent current switch 100. As previously noted, in a conventional bath-cooled MRI system, the persistent current switches are typically immersed in the coolant vessel containing liquid He. While cooling the switches, the liquid He is evaporated and vented out of the MRI system to an external environment. Further, to compensate for this vented liquid He, the coolant vessel is re-filled with a new liquid He, which is an expensive and time consuming event. In addition, this arrangement requires few hundreds of liters of liquid He to re-fill the coolant vessel. Some or all of these shortcomings of the currently available persistent current switches may be circumvented via use of embodiments consistent with the example persistent current switch 100.

In accordance with aspects of the present technique, the evaporated coolant from the cooling unit 104 is conveyed to the reservoir 110, where the evaporated coolant is re-condensed and conveyed back to the cooling unit 104. This re-condensation or recirculation of the evaporated coolant substantially minimizes or in some situations eliminates the need for refilling of the coolant, which in turn reduces size and weight of the reservoir 110. Also, since the coolant is re-condensed and used again in the cooling unit 104, use of hundreds of liters of coolant in MRI systems may be circumvented. This in turn reduces the manufacturing cost and the weight of the MRI systems.

Additionally, in accordance with further aspects of the present technique, the heating unit 108 is configured to enhance the temperature of the winding unit 106 above the threshold temperature. The threshold temperature may be representative to as a critical design temperature of the winding unit 106, above which the persistent current switch 100 is transitioned from the superconducting state to the normal state. Also, in one embodiment, the heating unit 108 may be disposed on the first layer 112 of the cooling unit 104. The heating unit 108 may be directly wound over a portion of an outer circumference of the first layer 112, in one example. In one embodiment, the heating unit 108 may include a first heating section 130 and a second heating section 132, which are separated by a determined distance on the cooling unit 104. For example, the first heating section 130 may be wound over the outer circumference of the first layer 112 at a first end of the cooling unit 104, while the second heating section 132 may be wound over the outer circumference of the first layer 112 at a second end of the cooling unit 104, as depicted in FIG. 1.

As noted herein above, the heating unit 108 is configured to heat the winding unit 106 so that the temperature of the winding unit 106 is enhanced above the threshold temperature or the critical temperature. More specifically, the heating unit 108 is configured to enhance the temperature of the winding unit 106 beyond the threshold temperature to transition the persistent current switch 100 from the superconducting state to the normal state.

In a presently contemplated configuration, the winding unit 106 is configured to alternatingly switch the persistent current switch 100 between the normal state and the superconducting state. The winding unit 106 may be disposed on the heating unit 108, in one embodiment. In an exemplary embodiment, the winding unit 106 may be a wire like structure that is wound over the outer circumference of the heating unit 108, as depicted in FIG. 1. In one embodiment, the winding unit 106 may be wound bifilar over the heating unit 108 to minimize inductance of the winding unit 106. Moreover, in one example, the winding unit 106 includes a first winding section 134 and a second winding section 136. The first winding section 134 may be wound over the first heating section 130, while the second winding section 136 may be wound over the second heating section 132, in one example.

Additionally, in one embodiment, the combination of the first winding section 134 and the first heating section 130 is employed to alternatingly switch the persistent current switch 100 between the normal state and the superconducting state. Furthermore, the combination of the second winding section 136 and the second heating section 132 may be used as a back-up unit to alternatingly switch the persistent current switch 100 between the normal state and the superconducting state. More specifically, the second winding section 136 and the second heating section 132 are used only when the combination of the first winding section 134 and the first heating section 130 fails to switch the persistent current switch 100. In one embodiment, both the winding sections 134, 136 along with their corresponding heating sections 130, 132 may be used simultaneously for operating the persistent current switch 100.

Additionally, in the embodiment illustrated in FIG. 1, the cooling unit 104 may include one or more filler materials 138 that are disposed within the inner circumference of the second layer 114 of the cooling unit 104. In certain embodiments, the filler material 138 is filled inside the second metal tube or the second layer 114 of the cooling unit 104. For example, the filler material 138 may include a low heat capacity (cp) material to reduce thermal lag in the persistent current switch 100. In one embodiment, the filler material 138 is used to fill the dead space or reduce the dead space in the cooling unit 104.

Furthermore, in certain embodiments, the persistent current switch 100 may include one or more superconducting joints 146 that are used to electrically couple the persistent current switch 100 to the superconducting magnet of the MRI system. The superconducting joints 146 are disposed proximate to the persistent current switch 100 such that the superconducting joints 146 are cooled along with the persistent current switch 100.

It may be noted that the persistent current switch 100 is initially assumed to be operating in the normal state. The normal state is representative of a state where the winding unit 106 provides high electrical resistance to the superconducting magnet (shown in FIG. 6). Also, to operate the persistent current switch 100 in the normal state, the temperature of the winding unit 106 is maintained above the threshold temperature.

Further, to switch the persistent current switch 100 from the normal state to the superconducting state, the heating unit 108 is de-energized or turned OFF and the cooling unit 104 is filled with the coolant 107 received from the reservoir 110. The coolant 107 is circulated in the cooling unit 104 to maintain and/or reduce the temperature of the winding unit 106 below the threshold temperature or the critical temperature. If the temperature of the winding unit 106 is below the threshold temperature, the persistent current switch 100 switches from the normal state to the superconducting state. As previously noted, the superconducting state may be representative of a state where the winding unit 106 provides zero resistance to the superconducting magnet. This zero resistance of the winding unit 106 helps to form a persistent loop with electric current circulating between the persistent current switch 100 and the superconducting magnet, without any further current supply from a power source (not shown in FIG. 1). In one embodiment, when the persistent current switch 100 is operating in the superconducting state, it may be noted that the external heat load on the persistent current switch 100 is relatively small. The source of external heat load may include thermal radiation. This small heat load can be further reduced using MLI-expand multilayer insulation around the persistent current switch 100. In another embodiment, the persistent current switch 100 may be a stand-alone entity with its own reservoir 110 and can be placed anywhere around the superconducting magnet in the vacuum space 102.

Typically, the persistent current switch 100 operates in the superconducting state if the temperature of the winding unit 106 is below the threshold temperature. Otherwise, the persistent current switch 100 operates in the normal state. To switch the persistent current switch 100 from the superconducting state to the normal state, the orifice or valve 124 at the inlet 116 of the cooling unit 104 is closed. Particularly, the orifice 124 is designed to block or choke the in-flow of the coolant from the reservoir 110 to the cooling unit 104, and also to prevent back-flow of the coolant from the inlet 116 of the cooling unit 104 to the reservoir 110. In addition, the heating unit 108 is energized or turned ON to heat the winding unit 106. By heating the winding unit 106, the temperature of the winding unit 106 is enhanced or increased above the threshold temperature. This increased temperature of the winding unit 106 causes the persistent current switch 100 to transition from the superconducting state to the normal state. This transition of the persistent current switch 100 to the normal state further causes the magnetic device, such as a magnetic coil (see FIG. 6) to switch to the normal state.

Additionally, since the heating unit 108 is disposed on the cooling unit 104, a portion of the heat produced by the heating unit 108 is absorbed by the coolant 107 in the cooling unit 104. This absorbed heat further causes the coolant 107 in the cooling unit 104 to evaporate. The evaporated coolant is then conveyed out of the cooling unit 104 via the outlet 118 of the cooling unit 104 to the reservoir 110 via the second channel 128. In one embodiment, a density difference of the cryogen, such as the coolant 107 may be employed to drive the evaporated coolant out of the cooling unit 104 to the reservoir 110 via the second channel 128. Further, the evaporated coolant is re-condensed and stored in the reservoir 110. During the switching of the persistent current switch 100 from the normal state to the superconducting state, this re-condensed coolant is circulated back to the cooling unit 104.

Thus, by employing the persistent current switch 100 of FIG. 1, the coolant 107 in the cooling unit 104 is efficiently utilized when used in MRI systems with low cryogen volume in a vacuum environment. In addition, since the persistent current switch 100 has its own cryogenic environment or cooling arrangement, the persistent current switch 100 may be used as a stand-alone entity. More specifically, the persistent current switch 100 may be placed proximate to the superconducting magnet or may conveniently be disposed at a distance from the superconducting magnet in a low-magnetic field region. Also, the exemplary persistent current switch 100 allows a relatively quick response time while alternatingly switching between the normal state and the superconducting state. For example, the persistent current switch 100 of FIG. 1 has a relatively small warm-up time and cool-down time of the switch 100. Also, the persistent current switch 100 is configured to switch from the superconducting state to the normal state within a first time period. The first time period may be in a range of about 1 minute to about 15 minutes depending on the PCS design constraints and the magnet design. Similarly, the persistent current switch 100 is configured to switch from the normal state to the superconducting state within a second time period. The second time period may be in a range of about 15 minutes to about 1 minute. In one embodiment, the persistent current switch 100 may be disposed in a horizontal position, a vertical position, or an inclined position on the superconducting magnet.

Figure 2:
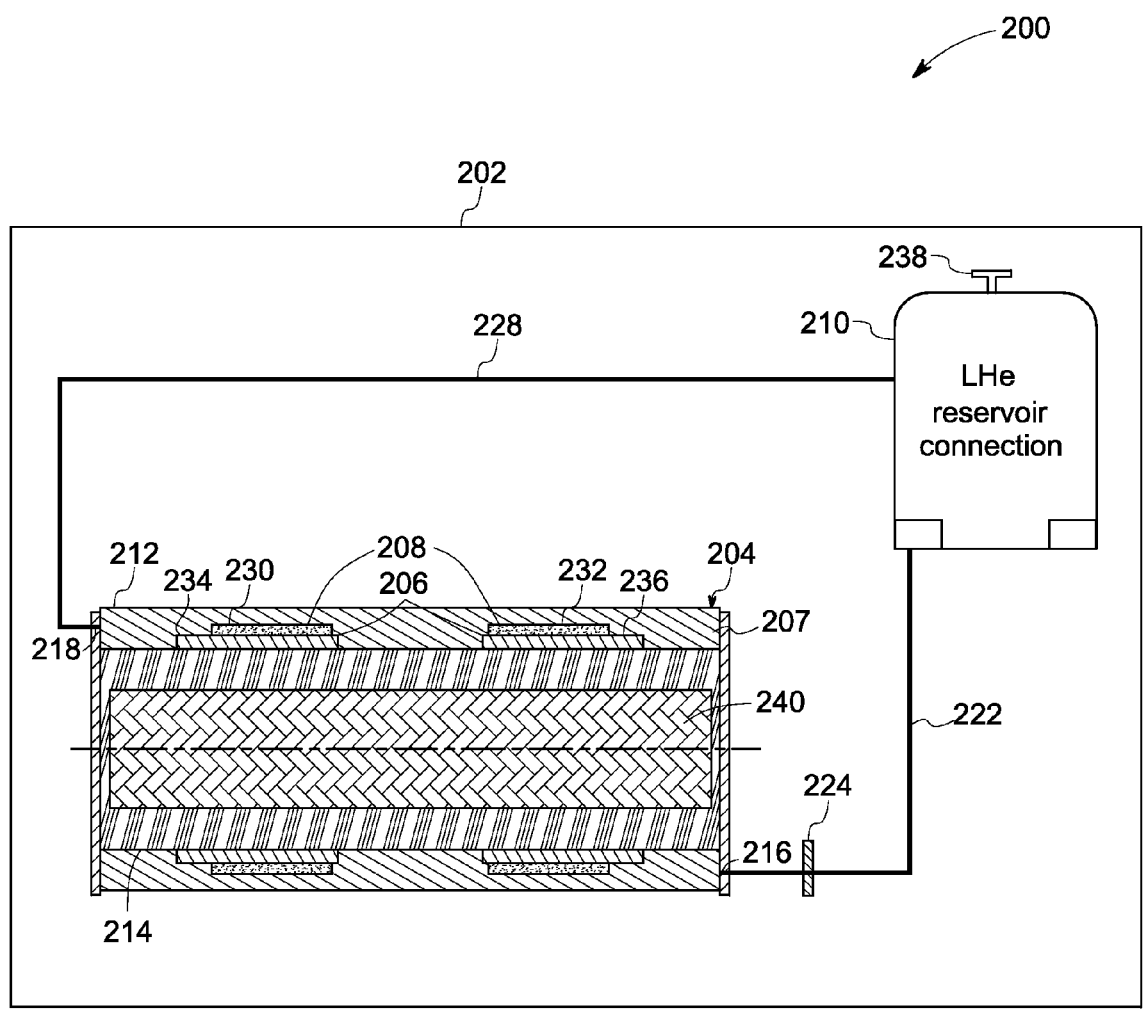
FIG. 2 is a cross-sectional side view of a persistent current switch, in accordance with other aspects of the present technique.

Referring to FIG. 2, a cross-sectional view of a persistent current switch 200, in accordance with another embodiment of the present technique, is depicted. The embodiment of FIG. 2 is similar to the embodiment of FIG. 1, except that while the winding unit 106 and the heating unit 108 in the embodiment of FIG. 1 are disposed outside the cooling unit 104, a winding unit 206 and a heating unit 208 in the embodiment of FIG. 2 are disposed within a cooling unit 204. In the embodiment depicted in FIG. 2, the winding unit 206 and the heating unit 208 are immersed in a coolant 207 stored in the cooling unit 204.

In a presently contemplated configuration, the persistent current switch 200 includes a vacuum chamber 202, the cooling unit 204, the winding unit 206, the heating unit 208, and a reservoir 210. The cooling unit 204 is configured to reduce the temperature of the winding unit 206 below a threshold temperature. The cooling unit 204 includes an inlet 216 and an outlet 218. The inlet 216 is configured to receive the coolant from the reservoir 210 via a first channel 222, and the outlet 218 is configured to convey the evaporated coolant from the cooling unit 204 to the reservoir 210 via a second channel 228. In certain other embodiments, the second channel 228 may not be connected to the reservoir 110. In addition, an orifice or valve 224 is disposed on the first channel 222 to regulate the flow of coolant from the reservoir 210 to the cooling unit 204. The reservoir may also include a release valve 238 that is used to release any pressure that is built-up within the reservoir 210. In one embodiment, the cooling unit 204 may include one or more filler materials 240 that are disposed within the inner circumference of the second layer 214 of the cooling unit 204.

Moreover, in accordance with aspects of the present technique, the winding unit 206 is configured to alternatingly switch the persistent current switch 200 between a normal state and a superconducting state. The winding unit 206 is wound over a second layer 214 of the cooling unit 204 such that the winding unit 206 is immersed in the coolant 207. In one embodiment, the winding unit 206 may be wound over a portion of the outer circumference of the second layer 214 of the cooling unit 204. Also, the winding unit 206 may include a first winding section 234 and a second winding section 236, which are separated by a determined distance on the second layer 214 of the cooling unit 204. For example, the first winding section 234 is wound over the outer circumference of the second layer 214 at a first end of the cooling unit 204, while the second heating section 236 is wound over the outer circumference of the second layer 214 at a second end of the cooling unit 204, as depicted in FIG. 2.

Furthermore, in a presently contemplated configuration, the heating unit 208 is disposed on the winding unit 206. The heating unit 208 is configured to heat the winding unit 206 such that the temperature of the winding unit 206 is enhanced or increased above the threshold temperature. In the embodiment of FIG. 2, the heating unit 208 includes a first heating section 230 and a second heating section 232. The first heating section 230 is wound over the first winding section 234, while the second heating section 232 is wound over the second winding section 236.

As previously described with reference to FIG. 1, the combination of the first winding section 234 and the first heating section 230 may be employed to alternatingly switch the persistent current switch 200 between the normal state and the superconducting state. Also, the combination of the second winding section 236 and the second heating section 232 may be used as a back-up unit to alternatingly switch the persistent current switch 200 between the normal state and the superconducting state. More specifically, the combination of the second winding section 236 and the second heating section 232 is used only when the combination of the first winding section 234 and the first heating section 230 fails to switch the persistent current switch 200.

Figure 3:
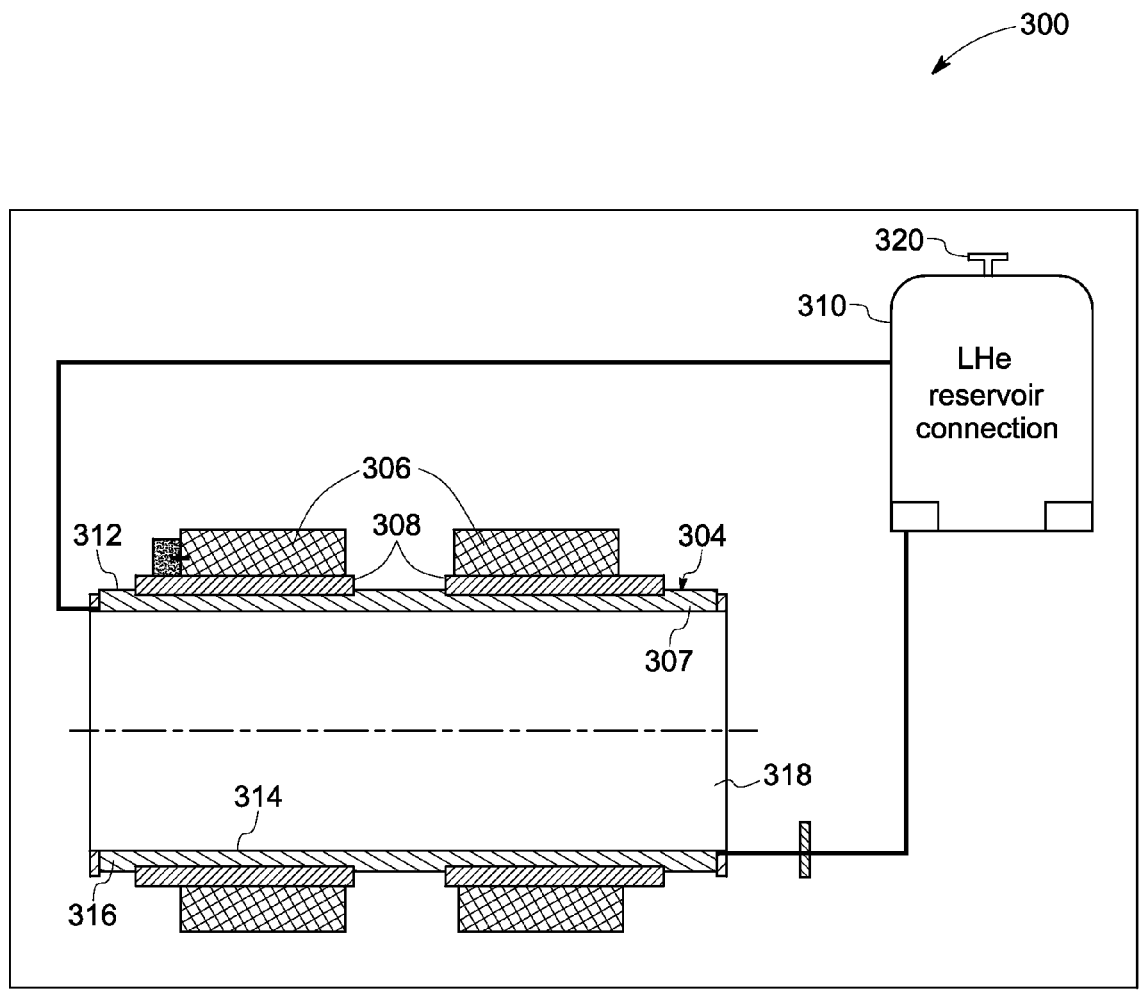
FIG. 3 is a cross-sectional side view of a persistent current switch, in accordance with yet another aspect of the present technique.

Turning now to FIG. 3, a cross-sectional side view of a persistent current switch 300, in accordance with yet another embodiment of the present technique, is depicted. The embodiment of FIG. 3 is similar to the embodiment of FIG. 1, except that while the cooling unit 104 in the embodiment of FIG. 1 is filled with the filler materials 138, a cooling unit 304 in the embodiment of FIG. 3 is not filled with any filler materials. The cooling unit 304 is formed by two metal tubes inserted into one another. A second metal tube 314 is inserted into a first metal tube 312 with a hollow space 316 between the first metal tube 312 and the second metal tube 314. This hollow space 316 is used for circulating a coolant 307 in the cooling unit 304. In addition, the cooling unit 304 includes a second hollow space 318 within the inner circumference of the second metal tube 314. It may be noted that the second hollow space 318 is devoid of any filler material.

In one embodiment, the cooling unit 304 may be a hollow cylindrical metal rod, e.g., copper rod. This embodiment of the persistent current switch 300 may have the fastest switch ON and switch OFF time. In particular, the persistent current switch 300 may have a substantially small switching time between the superconducting state and the normal state.

Further, the persistent current switch 300 also includes a winding unit 306, a heating unit 308, and a reservoir 310 having a release valve 320, which are arranged and operated in a manner that is substantially similar to the cooling unit 104, the winding unit 106, the heating unit 108, and the reservoir 110 of the persistent current switch 100 of FIG. 1.

Figure 4:
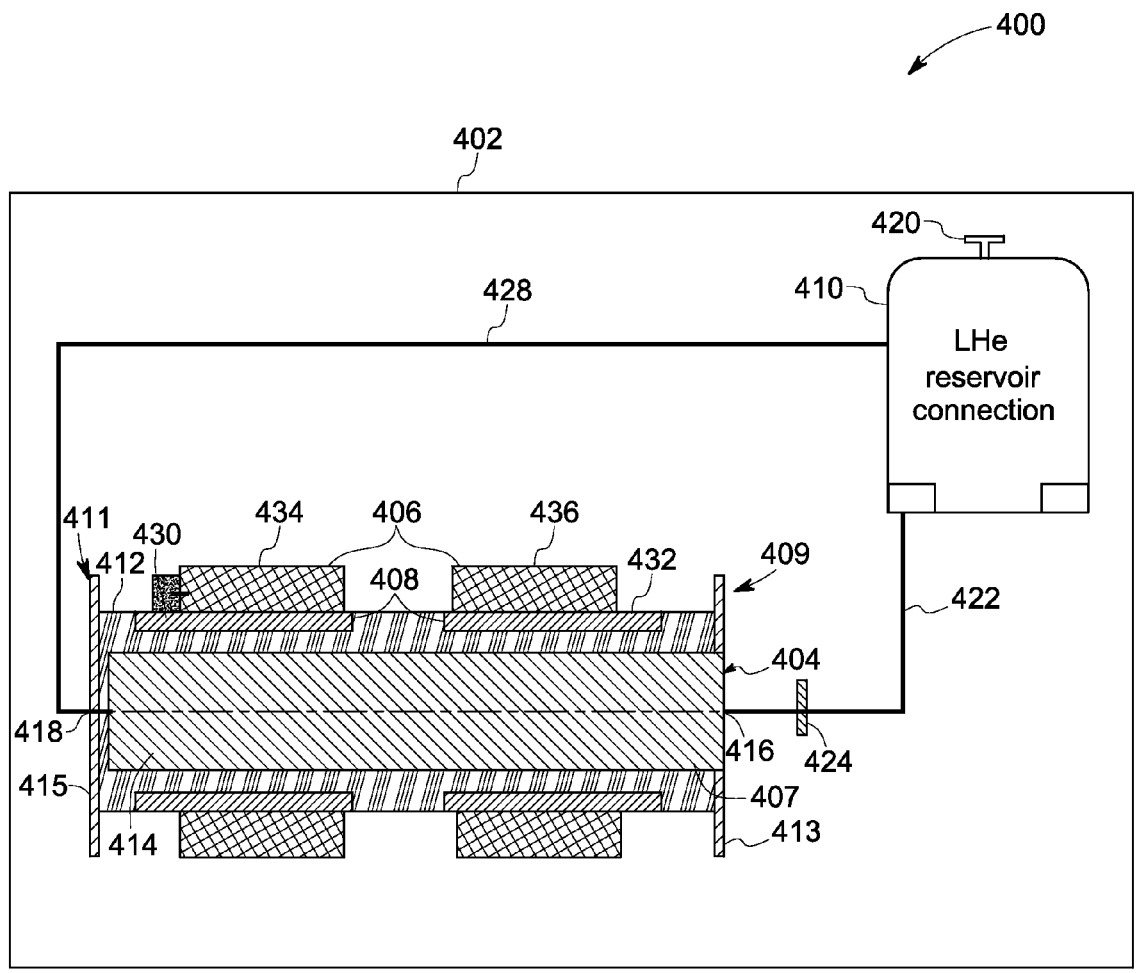
FIG. 4 is a cross-sectional side view of a persistent current switch, in accordance with aspects of the present technique.

FIG. 4 is a cross-sectional side view of a persistent current switch 400, in accordance with one more embodiment of the present technique. The persistent current switch 400 includes a vacuum chamber 402, a cooling unit 404, a winding unit 406, a heating unit 408, and a reservoir 410. In the exemplary embodiment of FIG. 4, at least the cooling unit 404, the winding unit 406, and the heating unit 408 are disposed within the vacuum chamber 402.

In a presently contemplated configuration, the cooling unit 404 is configured to reduce a temperature of the winding unit 406 below a threshold temperature. The cooling unit 404 may be formed with a single metal tube, as depicted in FIG. 4. The tube so formed may be referred to as a switch tube. For example, a single cylindrical layer 412 with a hollow space 414 in between may be considered as the cooling unit 404. This hollow space 414 is used for storing or circulating the coolant 407 within the cooling unit 404. Further, an inlet 416 may be formed at a first end 409 of the cooling unit 404 and an outlet 418 may be formed at a second end 411 of the cooling unit 404. Moreover, the first end 409 of the cooling unit 404 may be closed with a first metal cap 413 having the inlet 416 to receive the coolant from the reservoir 410 via a first channel 422. Similarly, the second end 411 of the cooling unit 404 may be closed with a second metal cap 415 having the outlet 418 to convey the evaporated coolant from the cooling unit 404 to the reservoir 410 via a second channel 428. In addition, an orifice or a valve 424 is disposed on the first channel 422 to regulate the flow of the coolant from the reservoir 410 to the cooling unit 404. The reservoir 410 may have a release valve 420 to control any pressure build-up within the reservoir 410. Furthermore, as previously noted, the release valve 420 may be configured to automatically and/or manually release any pressure built-up within the reservoir 410.

In accordance with aspects of the present technique, the coolant 407 in the cooling unit 404 absorbs the heat generated by the winding unit 406. Consequent to the absorption of the heat by the coolant 407, the winding unit 406 is cooled and the temperature of the winding unit 406 drops below the threshold temperature. This drop in temperature aids in switching the persistent current switch 400 from the normal state to the superconducting state.

In accordance with one embodiment, the heating unit 408 is configured to enhance the temperature of the winding unit 406 above the threshold temperature. The heating unit 408 is disposed on the layer 412 of the cooling unit 404. Particularly, a portion of the layer 412 on the outer circumference of the cooling unit 404 is etched or removed, as depicted in FIG. 4. Further, the heating unit 408 is wound over the cooling unit 404 to cover or fill the etched portion of the cooling unit 404. In the embodiment of FIG. 4, the heating unit 408 may include a first heating section 430 and a second heating section 432, which are separated by a determined distance on the cooling unit 404. For example, the first heating section 430 is wound over a first etched portion of the layer 412 at the second end 411 of the cooling unit 404, while the second heating section 432 is wound over a second etched portion of the first layer 412 at the first end 409 of the cooling unit 404, as depicted in FIG. 4. Moreover, the heating unit 408 is employed to heat the winding unit 406 so that the temperature of the winding unit 406 is enhanced or increased beyond the threshold temperature. More specifically, the temperature of the winding unit 406 is enhanced above the threshold temperature to transition the persistent current switch 400 from the superconducting state to the normal state.

Also, as previously noted, the winding unit 406 is configured to alternatingly switch the persistent current switch 400 between the normal state and the superconducting state. In a presently contemplated configuration, the winding unit 406 is disposed on the heating unit 408. The winding unit 406 may be a wire like structure that is wound over the outer circumference of the heating unit 408, as depicted in FIG. 4. Moreover, in one example, the winding unit 406 includes a first winding section 434 and a second winding section 436. The first winding section 434 is wound over the first heating section 430, while the second winding section 436 is wound over the second heating section 432. In one embodiment, the combination of the first winding section 434 and the first heating section 430 may be employed to alternatingly switch the persistent current switch 400 between the normal state and the superconducting state. Additionally, the combination of the second winding section 436 and the second heating section 432 may be used as a back-up unit to alternatingly switch the persistent current switch 400 between the normal state and the superconducting state. It may be noted that the combination of the second winding section 436 and the second heating section 432 is used only when the combination of the first winding section 434 and the first heating section 430 fails to switch the persistent current switch 400.

The persistent current switch 400 is typically assumed to be operating in the normal state. The normal state is generally representative of a state where the winding unit 406 provides high electrical resistance to the superconducting magnet (shown in FIG. 6). Also, to operate the persistent current switch 400 in the normal state, the temperature of the winding unit 406 is maintained above the threshold temperature.

Further, to switch the persistent current switch 400 from the normal state to the superconducting state, the heating unit 408 is de-energized or turned OFF and the cooling unit 404 is filled with the coolant 407 received from the reservoir 410. The coolant 407 is circulated in the cooling unit 404 to maintain or reduce the temperature of the winding unit 406 below the threshold temperature or the critical temperature. If the temperature of the winding unit 406 is below the threshold temperature, the persistent current switch 400 switches from the normal state to the superconducting state. The superconducting state is representative of a state where the winding unit 406 provides zero resistance to the superconducting magnet. This zero resistance of the winding unit 406 helps to form a persistent loop with electric current circulating between the persistent current switch 400 and the superconducting magnet, without any current supply from a power source (not shown in FIG. 4).

It may be noted that the various embodiments of the persistent current switch shown in FIGS. 1-4 may have different design parameters, such as the size of the orifice or valve, the thermal mass or filler materials used, and the arrangement of the winding unit around the cooling unit, to introduce various thermal resistances of the cooling unit. This in turn helps to fine-tune the desired switching characteristics, such as the switching time of the persistent current switch.

Typically, the persistent current switch 100 operates in the superconducting state if the temperature of the winding unit 106 is below the threshold temperature. The persistent current switch 100 is switched to the normal state in certain situations. For example, it may be desirable to switch the persistent current switch 100 to the normal state in case of an event of having to ramp down the magnet. To switch the persistent current switch 400 from the superconducting state to the normal state, the orifice or valve 424 at the inlet 416 of the cooling unit 404 is closed. Particularly, the orifice 424 is closed to choke or reduce the in-flow of coolant from the reservoir 410 to the cooling unit 404, and also to prevent the back-flow of the coolant from the cooling unit 404 to the reservoir 410 via the inlet 416 of the cooling unit 404. In addition, the heating unit 408 is energized or turned ON to heat the winding unit 406. By heating the winding unit 406, the temperature of the winding unit 406 is enhanced or increased above the threshold temperature, which causes the persistent current switch 400 to transition from the superconducting state to the normal state. This transition of the persistent current switch 400 to the normal state causes the magnetic device, such as a magnetic coil (see FIG. 6) to switch to the normal state for de-energizing the magnet.

In addition, since the heating unit 408 is disposed on the cooling unit 404, a portion of the heat produced by the heating unit 408 is absorbed by the coolant 407 in the cooling unit 404. This absorbed heat further causes the coolant to evaporate in the cooling unit 404. The evaporated coolant is then conveyed out of the cooling unit 404 via the outlet 418 of the cooling unit 404 to the reservoir 410 via the second channel 428. Further, the evaporated coolant is re-condensed and stored in the reservoir 410. During the switching of the persistent current switch 400 from the normal state to the superconducting state, this re-condensed coolant is circulated back to the cooling unit 404.

Thus, by employing the persistent current switch 400 of FIG. 4, the coolant 407 in the cooling unit 404 is efficiently utilized to reduce the transfer of heat load to the small reservoir 410. In addition, since the persistent current switch 400 has its own cryogenic environment or cooling arrangement, the persistent current switch 400 may be used as a stand-alone entity. Moreover, the persistent current switch 400 may be placed proximate to the superconducting magnet in a high-magnetic field region or may be disposed at a distance from the superconducting magnet in a low-magnetic field region.

Figure 5:
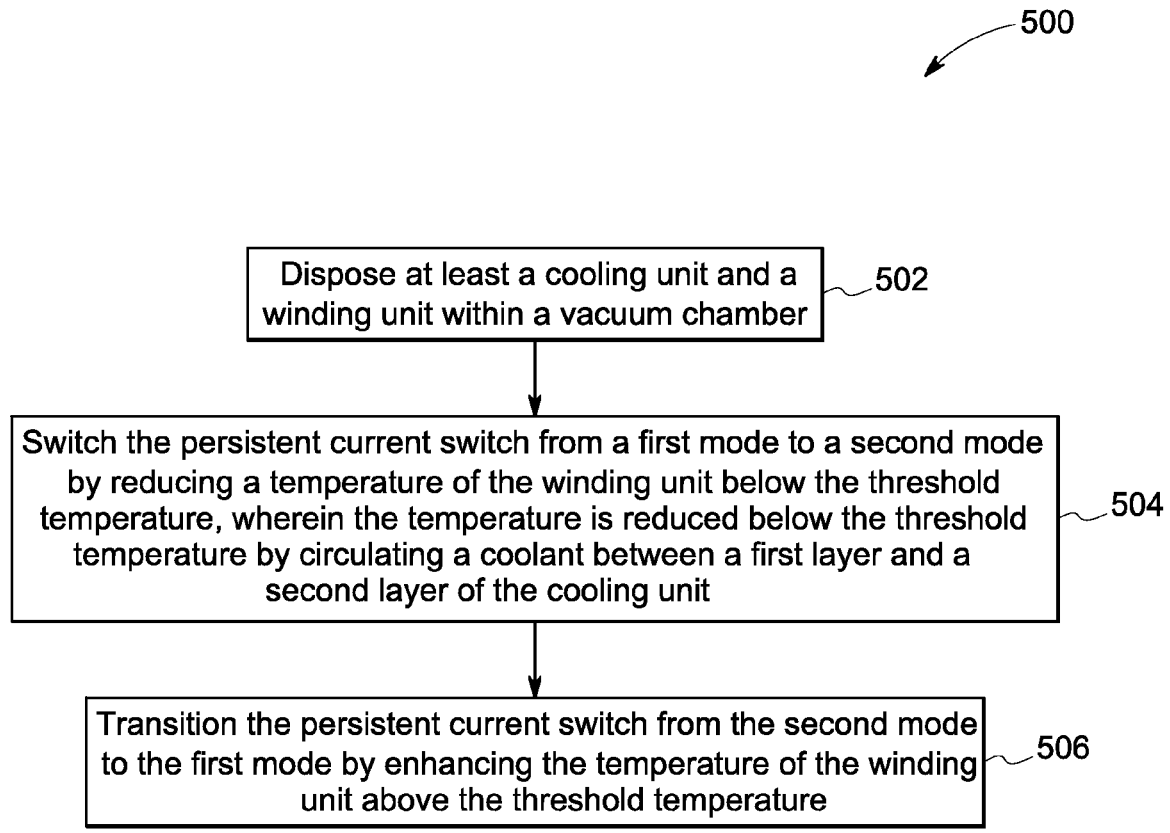
FIG. 5 is a flow chart illustrating a method for alternatingly switching the persistent current switch between a first mode and a second mode, in accordance with aspects of the present technique.

Referring to FIG. 5, a flow chart 500 illustrating a method for alternatingly switching a persistent current switch, such as the persistent current switch 100 of FIG. 1 between a first mode and a second mode, in accordance with aspects of the present technique, is depicted. For ease of understanding of the present technique, the method is described with reference to the components of FIG. 1. It may be noted that the first mode is representative of a normal state, while the second mode is representative of a superconducting state of the persistent current switch 100. Also, in the normal state, the persistent current switch 100 provides high electrical resistance to a current flowing in the magnetic device (see FIG. 6). However, in the superconducting state, the persistent current switch 100 provides zero resistance to the current flowing in the magnetic device.

The method begins at a step 502, where a cooling unit, such as the cooling unit 104 of FIG. 1 and a winding unit, such as the winding unit 106 of FIG. 1 are disposed within a vacuum chamber, such as the vacuum chamber 102 of FIG. 1. Particularly, the cooling unit 104 is disposed within the vacuum chamber 102 and the winding unit 106 is disposed on at least one of the first layer 112 and the second layer 114 of the cooling unit 104. In one embodiment, a heating unit, such as the heating unit 108 of FIG. 1, is wound over the cooling unit 104, and the winding unit 106 is disposed on the heating unit 108. In another embodiment, the winding unit 106 is wound over the cooling unit 104 and the heating unit 108 is disposed on the winding unit 106. The cooling unit 104 includes the inlet 116 and the outlet 118. The inlet 116 is operatively coupled to the outlet 120 of the reservoir 110 via the first channel 122. Similarly, the outlet 118 is operatively coupled to the inlet 126 of the reservoir 110 via the second channel 128.

Subsequently, the cooling unit 104 circulates the coolant 107 between the first layer 112 and the second layer 114 of the cooling unit 104. Since the cooling unit 104 is coupled to the reservoir 110, the coolant 107 is initially received from the reservoir 110 and stored between the first layer 112 and the second layer 114 of the cooling unit 104. Further, the coolant 107 is circulated in the cooling unit 104 to absorb heat generated by the winding unit 106, which in turn reduces a temperature of the winding unit 106. In one embodiment, the coolant is received from the reservoir 110 when the heating unit 108 is de-energized or turned OFF and at least a portion of the coolant 107 is evaporated.

Further, at step 504, the persistent current switch 100 is switched from the first mode or normal state to the second mode or superconducting state by reducing the temperature of the winding unit 106 below the threshold temperature. The temperature of the winding unit 106 is reduced below the threshold temperature using the coolant 107 between the first layer 112 and the second layer 114 of the cooling unit 104. Particularly, the coolant 107 circulating in the cooling unit 104 may be employed to absorb the heat generated by the winding unit 106, thereby cooling the winding unit 106. Absorption of the heat by the coolant 107 results in dropping the temperature of the winding unit 106 below the threshold temperature. Consequent to the drop in temperature below the threshold temperature, the persistent current switch 100 is switched from the normal state or first mode to the superconducting state or second mode. In addition, during the process of cooling the temperature of the winding unit 106, a portion of the coolant in the cooling unit 104 may be evaporated. More specifically, the heat generated by the winding unit 106 is absorbed by the coolant 107 in the cooling unit 104, which is turn evaporates the coolant 107. The evaporated coolant is then conveyed out of the cooling unit 104 via the outlet 118 of the cooling unit 104. Further, the evaporated coolant is conveyed to the reservoir 110 via the second channel 128. At the reservoir 110, the evaporated coolant is re-condensed to liquid coolant and conveyed back to the cooling unit 104.

Additionally, at step 506, the heating unit 108 is employed to heat the winding unit 106 to enhance the temperature of the winding unit 106 to a temperature above the threshold temperature. By enhancing the temperature above the threshold temperature, the persistent current switch 100 is transitioned from the second mode to the first mode. Initially, while operating the persistent current switch 100 in the superconducting state or the second mode, the temperature of the winding unit 106 is maintained below the threshold temperature by circulating the coolant 107 in the cooling unit 104. Subsequently, to transition the persistent current switch 100 from the superconducting state to the normal state, the temperature of the winding unit 106 is enhanced above the threshold temperature. To enhance or increase the temperature, the heating unit 108 is employed to heat the winding unit 106. Thus, by employing the above method, the persistent current switch is alternately switched between the first mode and the second mode.

Figure 6:
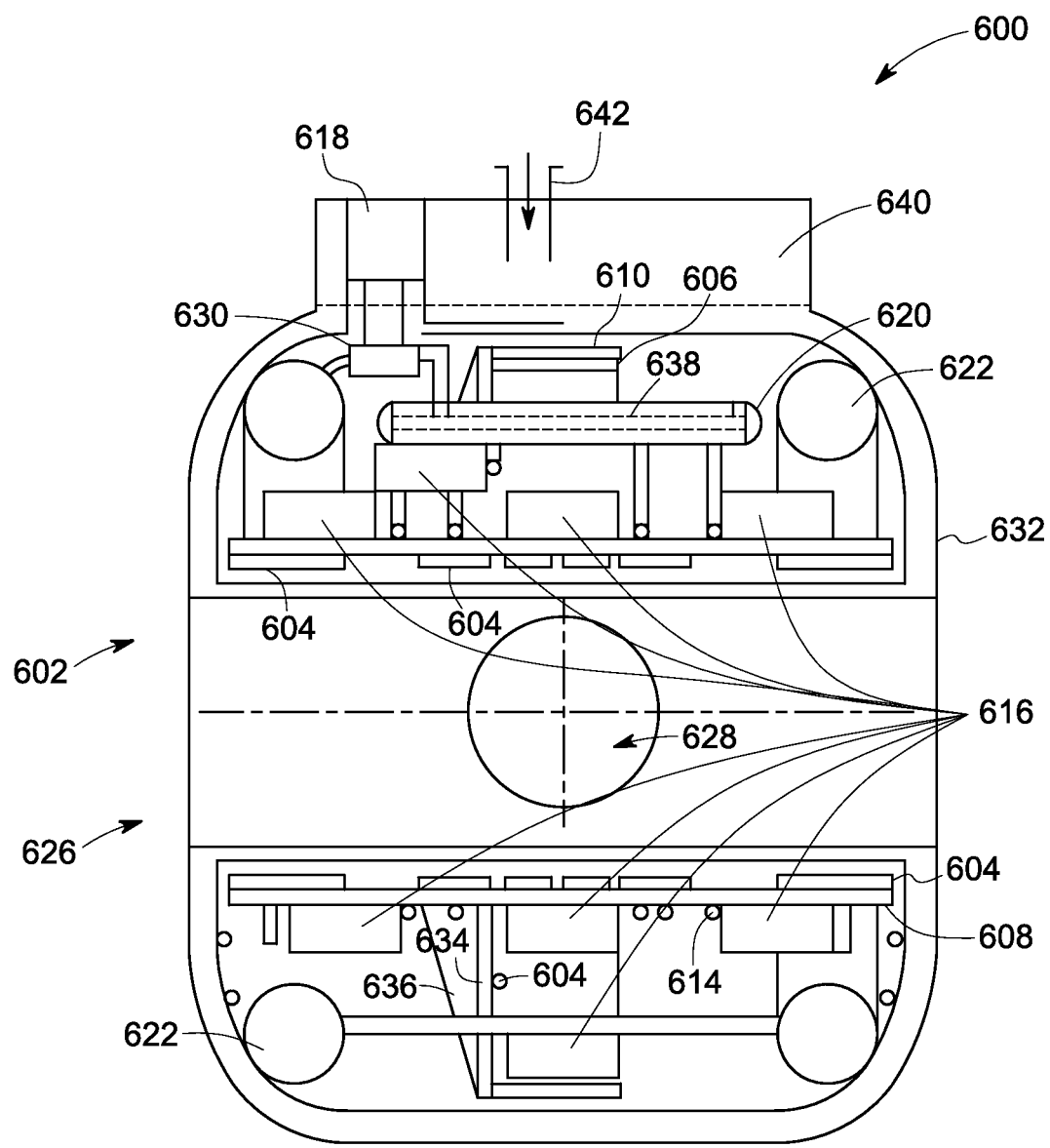
FIG. 6 is a side schematic view of an MRI magnet system that includes the persistent current switch of FIG. 1.

FIG. 6 is a cross sectional view of an MRI system 600 that includes the persistent current switch 100 (see FIG. 1), in accordance with aspects of the present technique. The MRI magnet system 600 of FIG. 6 is a low cryogen MRI magnet arrangement providing cryorefrigeration. In this embodiment, the MRI magnet system 600 includes a superconducting MRI magnet 602 formed from concentric superconducting main coils 604 and bucking coils 606 supported inside cylindrical shells (a coil support shell 608 and a coil support shell 610) of high thermal conductivity, and cooled by the cryorefrigerator 618 through a helium thermosiphon system. Thus, there is radial spacing between the superconducting main coils 604 and bucking coils 606, which are each supported on different coil support shells 608 and 610, respectively. The coil support shells 608, 610 are formed as cylindrical shells with cooling tubes 614 thermally coupled (e.g., bonded) to an outside surface of the coil support shell 608. For example, the coil support shells 608, 610 may have circumferentially extending solid metal walls that define a bore therein.

In addition, the MRI system 600 includes one or more persistent current switches 616, such as the persistent current switch 100 of FIG. 1. The persistent current switches 616 are operatively coupled to the superconducting MRI magnet 602. Particularly, the persistent current switches 616 are electrically coupled to the superconducting main coils 604 and/or the bucking coils 606. The persistent current switches 616 are used to operate the superconducting main coils 604 in a persistent current mode as described with reference to FIGS. 1-5. Further, the cryorefrigerator 618 and He storage vessels (illustrated as tanks forming a liquid He storage system 620) may be representative of the reservoir 110 of FIG. 1.

The superconducting coils 604 and/or the bucking coils 606 are molded with epoxy resin. For example, the molded coils may be wound with wet epoxy and cured to form self-supporting structures. The superconducting coils 604 and/or the bucking coils 606 then may be bonded to the coil support shells 608 and 610, respectively. The formed superconducting coils 604 and/or the bucking coils 606 are sized to define a bore 626 therethrough which is used to image an object (e.g., a patient). For example, a field of view (FOV) 628 may be defined to image a particular portion of the object.

Moreover, a helium thermosiphon arrangement includes an evaporator system with the plurality of the cooling tubes 614 thermally attached to the coil support shells 608 and/or 610, a recondenser 630 thermally attached to the cryorefrigerator 618, and He storage vessels 620, 622, all contained inside a magnet vacuum vessel 632. In one embodiment, a cooling unit, such as the cooling unit 104, housing the persistent current switch 616 is operatively coupled to the helium thermosiphon arrangement via the cooling tubes 614. It may be noted that FIG. 6 shows one or more possible locations and arrangements of the persistent current switch 616 in a low cryogen magnet or MRI system 600.

Additionally, the helium thermosiphon system includes two toroidal shaped He gas storage tanks 622, which contain about 200 to 300 liters of He gas, which varies based on the amount of cooling needed or desired. In various embodiments, the liquid He storage tank 620 receives liquid He from the recondenser 630, and supplies liquid He to the cooling tubes 614 coupled to the cold mass support structure, namely the coil support shells 608 and/or 610.

Moreover, manifold 638 receives vapor He (He gas) from the cooling tubes 614 and returns the He gas to the recondenser 630. The He gas storage tanks 622 are charged initially with between 30 and 40 atm He gas at ambient temperature. In operation, when the cryorefrigerator 618 is energized or turned ON, the recondenser 630 draws He from the He gas storage tanks 622, and sets up a free convection circulation loop that cools down the coils 604 and 606 and support mass (the coil support shells 608 and/or 610) to a cryogenic temperature, as well as fills the liquid He storage tank 620 with between about 8 and 10 liters of liquid He. In operation, the liquid He in the liquid He storage tank 620 is used to provide cooling to the magnet 602 and the persistent current switches 616, for example, during power interruptions, or shut down of the cryorefrigerator 618, such as for service, up to 10-12 hours. In various embodiments, once the thermosiphon system is turned ON, the system cools itself, thereby forming a free convection circulation system. It may be noted that the MRI magnet system 600 also includes a service box 640, receiving power leads 642 for powering the coils 604 and 606, as well as other components of the MRI magnet system 600.

Thus, various embodiments provide an MRI magnet system having molded superconducting coils and persistent current switches that are conduction cooled and structurally supported by high thermal conductivity cylindrical shells, which can operate at a temperature of 4.2 K. Moreover, the magnet weight is reduced by eliminating a large liquid He storage vessel that is typically used in superconducting magnets, and by making the coil support components out of aluminum. In various embodiments, no servicing or adding of cryogen is needed and the overall system weight is between about 2000 pounds and 2500 pounds.

The system and the method for alternatingly switching the persistent current switch described hereinabove aid in reducing the manufacture cost and weight of magnetic device, such as the MRI systems. Also, since the evaporated coolant is re-condensed and circulated back to the cooling unit of the persistent current switch, use of thousands of liters of coolant or liquid He in the reservoir or storage vessel may be prevented. Moreover, the arrangement of the present technique provides a very quick response time, such as the quick warm-up time and the cool down time, for the persistent current switch.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A persistent current switch for alternatingly switching between a first mode and a second mode, comprising:
    a vacuum chamber;
    a cooling unit disposed within the vacuum chamber and configured to circulate a coolant between a first layer and a second layer of the cooling unit, wherein the cooling unit comprises:
        an inlet coupled to a coolant reservoir and configured to receive the coolant from the coolant reservoir;
        an outlet coupled to the coolant reservoir and configured to convey evaporated coolant from the cooling unit to the coolant reservoir;
    a winding unit disposed on at least one of the first layer and the second layer of the cooling unit and configured to switch the persistent current switch from the first mode to the second mode when a temperature associated with the winding unit is below a threshold temperature;
    a heating unit thermally coupled to the winding unit and configured to enhance the temperature of the winding unit above the threshold temperature to transition the persistent current switch from the second mode to the first mode,
    wherein the inlet of the cooling unit is configured to receive the coolant from the coolant reservoir when the heating unit is de-energized and at least a portion of the coolant is evaporated, and wherein the outlet of the cooling unit is configured to convey the evaporated coolant to the coolant reservoir when the heating unit is energized; and
    a filler material disposed within an inner circumference of the second layer of the cooling unit, wherein the filler material is configured to stabilize the temperature of the winding unit.

2. The persistent current switch of claim 1, wherein the cooling unit is configured to circulate the coolant between the first layer and the second layer of the cooling unit to absorb heat generated by the winding unit.

3. The persistent current switch of claim 2, wherein the cooling unit is configured to reduce the temperature of the winding unit below the threshold temperature.

4. The persistent current switch of claim 1, wherein the heating unit is disposed on the first layer of the cooling unit and the winding unit is disposed on the heating unit.

5. The persistent current switch of claim 1, wherein the coolant is circulated in a hollow space within the second layer of the cooling unit.

6. The persistent current switch of claim 1, wherein the coolant comprises at least one of liquid helium (LHe), liquid hydrogen ($LH_2$), liquid neon (LNe), and liquid nitrogen ($LN_2$).

7. A persistent current switch for alternatingly switching between a first mode and a second mode, comprising:
    a vacuum chamber;
    a cooling unit disposed within the vacuum chamber and configured to circulate a coolant between a first layer and a second layer of the cooling unit, wherein the cooling unit comprises:
        an inlet coupled to a coolant reservoir and configured to receive the coolant from the coolant reservoir;
        an outlet coupled to the coolant reservoir and configured to convey evaporated coolant from the cooling unit to the coolant reservoir;
    a winding unit disposed on at least one of the first layer and the second layer of the cooling unit and configured to switch the persistent current switch from the first mode to the second mode when a temperature associated with the winding unit is below a threshold temperature;
    a heating unit thermally coupled to the winding unit and configured to enhance the temperature of the winding unit above the threshold temperature to transition the persistent current switch from the second mode to the first mode,
    wherein the heating unit is disposed on the first layer of the cooling unit and the winding unit is disposed on the heating unit,
    wherein the inlet of the cooling unit is configured to receive the coolant from the coolant reservoir when the heating unit is de-energized and at least a portion of the coolant is evaporated, and wherein the outlet of the cooling unit is configured to convey the evaporated coolant to the coolant reservoir when the heating unit is energized; and
    a filler material disposed within an inner circumference of the second layer of the cooling unit, wherein the filler material is configured to stabilize the temperature of the winding unit.

* * * * *

UNITED STATES PATENT AND TRADEMARK OFFICE
CERTIFICATE OF CORRECTION

Page 1 of 1

PATENT NO.       : 8,922,308 B2
APPLICATION NO.  : 13/285038
DATED            : December 30, 2014
INVENTOR(S)      : Stautner It is certified that error appears in the above-identified patent and that said Letters Patent is hereby corrected as shown below:

In the Specification

In Column 8, Line 55, delete "heating section 236" and insert -- heating section 232 --, therefor.

Signed and Sealed this
Seventh Day of April, 2015

Michelle K. Lee
*Director of the United States Patent and Trademark Office*